(12) United States Patent
Miyazaki

(10) Patent No.: US 10,590,537 B2
(45) Date of Patent: Mar. 17, 2020

(54) COATING DEVICE AND COATING METHOD

(71) Applicant: MURATA MANUFACTURING CO., LTD., Kyoto-fu (JP)

(72) Inventor: Toshiki Miyazaki, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 15/488,692

(22) Filed: Apr. 17, 2017

(65) Prior Publication Data

US 2017/0306489 A1    Oct. 26, 2017

(30) Foreign Application Priority Data

Apr. 25, 2016 (JP) ................. 2016-086881

(51) Int. Cl.
| | | |
|---|---|---|
| C23C 16/458 | (2006.01) | |
| C23C 16/50 | (2006.01) | |
| C23C 16/02 | (2006.01) | |
| H01J 37/32 | (2006.01) | |
| H01G 4/30 | (2006.01) | |
| H01G 4/12 | (2006.01) | |
| H01G 13/00 | (2013.01) | |
| H01G 4/232 | (2006.01) | |
| B05D 5/08 | (2006.01) | |
| B05D 1/00 | (2006.01) | |

(52) U.S. Cl.
CPC ........ *C23C 16/458* (2013.01); *C23C 16/0245* (2013.01); *C23C 16/50* (2013.01); *H01G 4/12* (2013.01); *H01G 4/232* (2013.01); *H01G 4/2325* (2013.01); *H01G 4/30* (2013.01); *H01G 13/006* (2013.01); *H01J 37/32458* (2013.01); *H01J 37/32568* (2013.01); *H01J 37/32715* (2013.01); *B05D 1/62* (2013.01); *B05D 5/083* (2013.01)

(58) Field of Classification Search
CPC ................................................... C23C 16/458
See application file for complete search history.

(56) References Cited

U.S. PATENT DOCUMENTS

| | | | | |
|---|---|---|---|---|
| 6,060,129 | A * | 5/2000 | Thomas .................... | B05D 1/62 |
| | | | | 204/192.14 |
| 2004/0052984 | A1 * | 3/2004 | Toth ......................... | B22F 1/02 |
| | | | | 428/34.1 |
| 2005/0202243 | A1 * | 9/2005 | Bohach .................. | B82Y 30/00 |
| | | | | 428/402 |
| 2009/0092752 | A1 * | 4/2009 | Brandt, Jr. ........... | A23G 3/0095 |
| | | | | 427/212 |
| 2016/0005897 | A1 * | 1/2016 | Honda .................... | H01L 31/18 |
| | | | | 136/256 |

FOREIGN PATENT DOCUMENTS

| | | |
|---|---|---|
| JP | 2009-503781 A | 1/2009 |
| WO | 2007/013703 A1 | 2/2007 |

* cited by examiner

*Primary Examiner* — Joseph A Miller, Jr.
(74) *Attorney, Agent, or Firm* — Studebaker & Brackett PC

(57) ABSTRACT

A coating device including a housing case capable of housing therein a plurality of processing targets and configured to coat the plurality of processing targets with a gaseous component by taking gas into the housing case. A rotation body is configured to rotate the housing case. The housing case includes a through-hole for taking gas inside and a stirring plate protruding from an internal wall of the housing case is used to stir the plurality of processing targets.

12 Claims, 4 Drawing Sheets

COATING DEVICE AND COATING METHOD

CROSS REFERENCE TO RELATED APPLICATIONS

This application claims benefit of priority to Japanese Patent Application 2016-086881 filed Apr. 25, 2016, the entire content of which is incorporated herein by reference.

TECHNICAL FIELD

The present disclosure relates to a device and a method that coat a processing target, and particularly relates to a coating device and a coating method used to modify the surface of a processing target and improve a surface characteristic.

BACKGROUND

Japanese Unexamined Patent Application Publication (Translation of PCT Application) No. 2009-503781 discloses a device configured to coat a processing target by injecting reactive gas into a reaction chamber to generate plasma and spraying the generated plasma toward the processing target.

SUMMARY

However, in the device disclosed in Japanese Unexamined Patent Application Publication (Translation of PCT Application) No. 2009-503781, when plasma is sprayed on a plurality of processing targets being placed on top of one another, not the entire surface of all processing targets can be uniformly coated.

The present disclosure is intended to solve the above-described problem and provide a coating device and a coating method that are capable of uniformly coating the entire surface of a plurality of processing targets that are difficult to uniformly coat when the processing targets are placed on top of one another.

To solve the above-described problem, a coating device according to the present disclosure includes a housing case capable of housing a plurality of processing targets therein and is configured to coat the processing targets with a gaseous component by taking gas into the housing case. The coating device includes a rotation unit configured to rotate the housing case. The housing case includes a through-hole for taking the gas inside and a stirring plate protruding from an internal wall of the housing case to stir the processing targets.

The housing case may be cylindrical. The stirring plate may be formed in a helical shape along the internal wall of the housing case.

The coating may provide an oil repelling property or a lipophilic property to surfaces of the processing targets.

A coating method according to the present disclosure coats a plurality of processing targets with a gaseous component by taking gas into a housing case capable of housing therein the processing targets. The method comprises taking the gas into the housing case through a through-hole provided in the housing case; and coating the plurality of processing targets while rotating the housing case housing the plurality of processing targets therein and provided with a stirring plate protruding from an internal wall of the housing case.

In the above-described coating method, the housing case may be cylindrical and the stirring plate may be formed in a helical shape along the internal wall of the housing case.

According to the present disclosure, a plurality of processing targets are coated with a gaseous component while being stirred by a stirring plate protruding from an internal wall of a housing case as the housing case is rotated. This prevents the processing targets in the housing case from being placed on top of one another, thereby making it possible to perform uniform coating of the entire surface of the processing targets.

DETAILED DESCRIPTION

An embodiment of the present disclosure is presented below to more specifically describe characteristics of the present disclosure.

Figure 1:
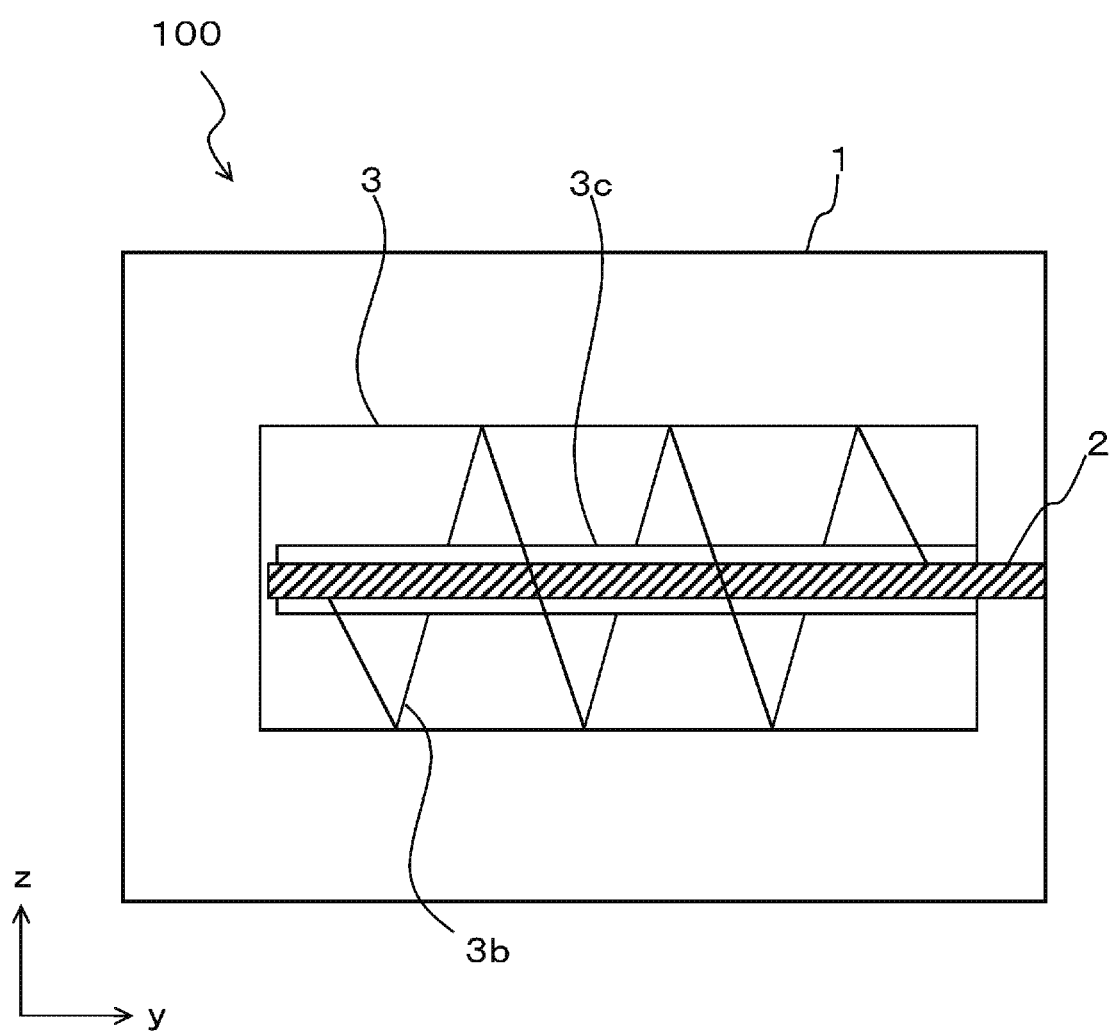
FIG. 1 is a side cross-sectional view of a coating device according to an embodiment of the present disclosure.
Figure 2:
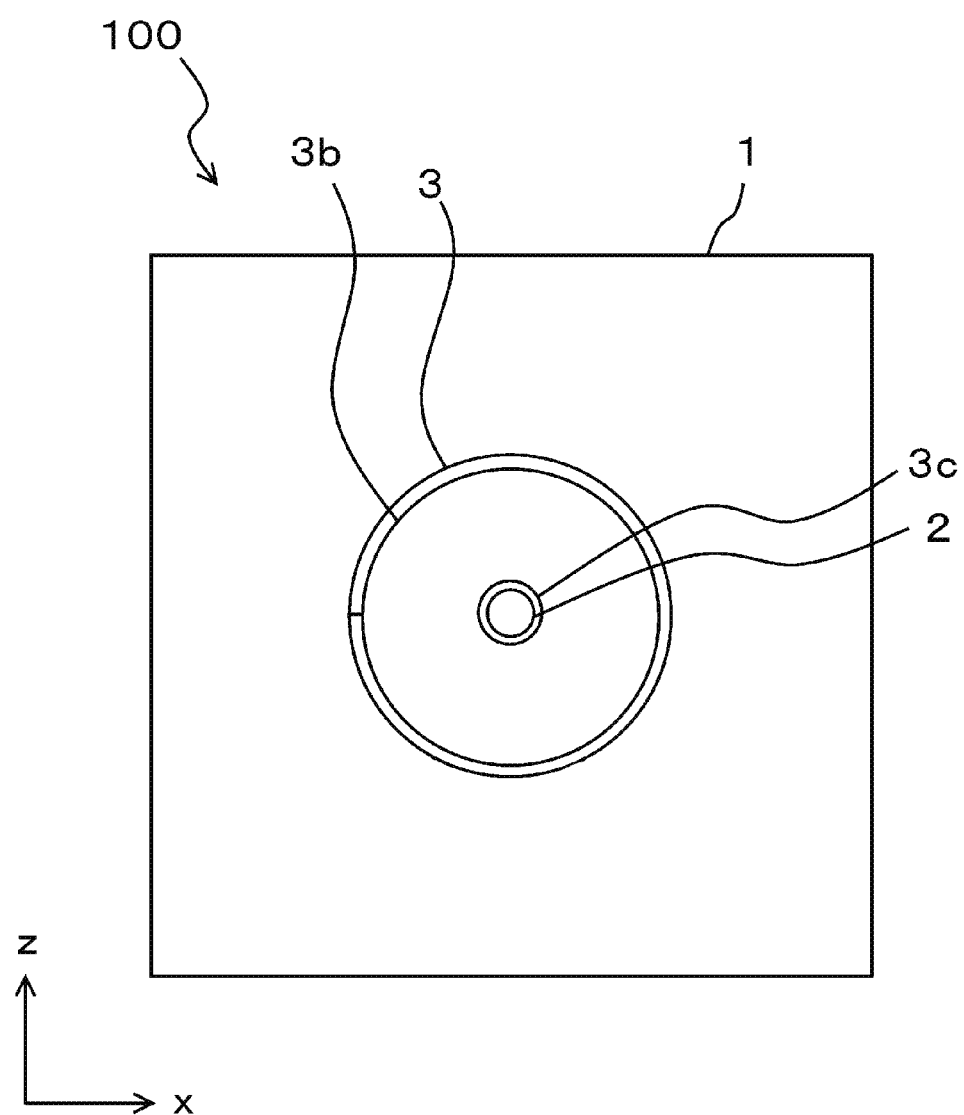
FIG. 2 is a front cross-sectional view of the coating device according to the embodiment of the present disclosure.

FIG. 1 is a side cross-sectional view of a coating device 100 according to an embodiment of the present disclosure, and FIG. 2 is a front cross-sectional view of the coating device 100.

The coating device 100 includes an electrode 1, an electrode 2, a housing case 3, and a rotation body (not illustrated) configured to rotate the housing case.

One of the electrode 1 and the electrode 2 is a positive electrode, and the other is a negative electrode. For example, the electrode 1 is a negative electrode, and the electrode 2 is a positive electrode. The electrode 1 is a box structure having a rectangular parallelepiped shape and serving as a chamber of the coating device 100. Thus, in the present specification, the chamber is the electrode 1. The electrode 2 has a bar shape extending in the y-axis direction in FIG. 1. The electrode 1 and the electrode 2 are formed not to be electrically connected with each other.

The housing case 3 is a case for housing therein a plurality of processing targets to be coated.

FIGS. 1 and 2 illustrate a state in which the housing case 3 is placed inside the chamber or electrode 1, but the housing case 3 can be taken out of the chamber or electrode 1. The housing case 3 is a cylindrical container extending in one direction and made of glass. However, the shape of the housing case 3 is not limited to a cylindrical shape, and the material thereof is not limited to glass.

Figure 3:
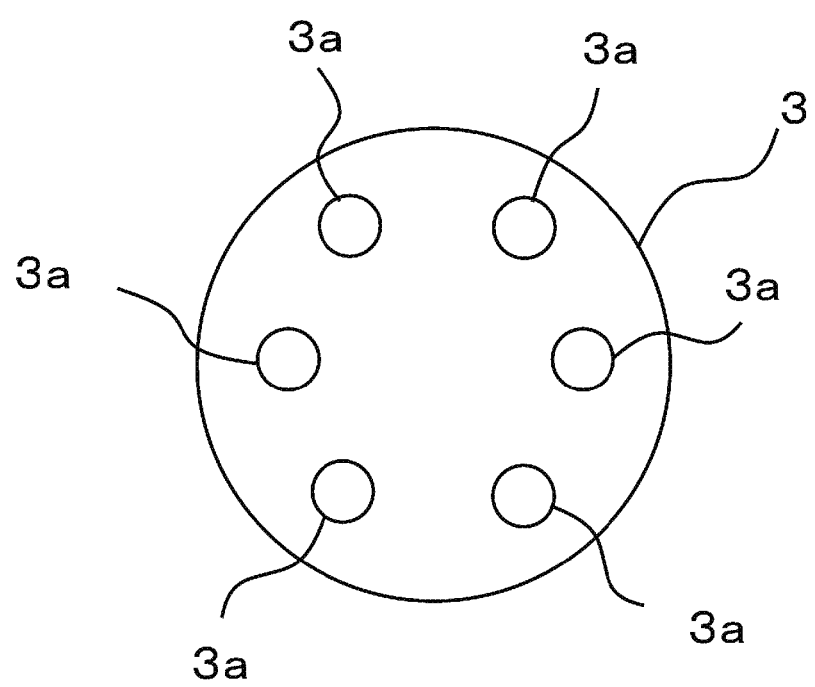
FIG. 3 is a diagram illustrating an end face of a housing case in a longitudinal direction.

As illustrated in FIG. 3, a plurality of through-holes 3a for taking in coating gaseous material are disposed on both end faces of the housing case 3 in the y-axis direction. In the present embodiment, six circular through-holes 3a are disposed on each end face of the housing case 3, but the number of through-holes 3a and the shape thereof are not particularly limited. Arrangement positions of the through-holes 3a for taking in gaseous material are not particularly limited, and the through-holes 3a may be provided on an outer peripheral wall of the housing case 3.

The housing case 3 is provided with a stirring plate 3b protruding from an internal wall of the housing case 3 and used to stir the processing targets. Specifically, the stirring plate 3b formed in a helical shape along the internal wall of the housing case 3 is provided to the internal wall of the housing case 3. A direction in which the helix proceeds is aligned with the y-axis direction, in other words, a longitudinal direction of the housing case 3. The stirring plate 3b can be made of glass like the housing case 3, but is not limited to glass.

The housing case 3 is provided with an insulation wall 3c capable of housing the electrode 2 inside. The insulation wall 3c has a cylindrical shape and is made of glass like the housing case 3. The insulation wall 3c provides insulation between the electrode 2 inside the insulation wall 3c and the processing targets outside the insulation wall 3c at coating of the processing targets.

The rotation body may include inside a power source such as a motor and be self-driven to rotate, or may include no power source and be rotated by power of an external power source. The rotation body is rotatable not only in one direction but also in the opposite direction.

The processing targets to be coated are each a ceramic laminated body already subjected to firing, in other words, a precursor of a multilayer ceramic capacitor prior to formation of external electrodes, which is formed in, for example, a process of manufacturing a multilayer ceramic capacitor and provided with external electrodes to function as a multilayer ceramic capacitor.

Figure 4:
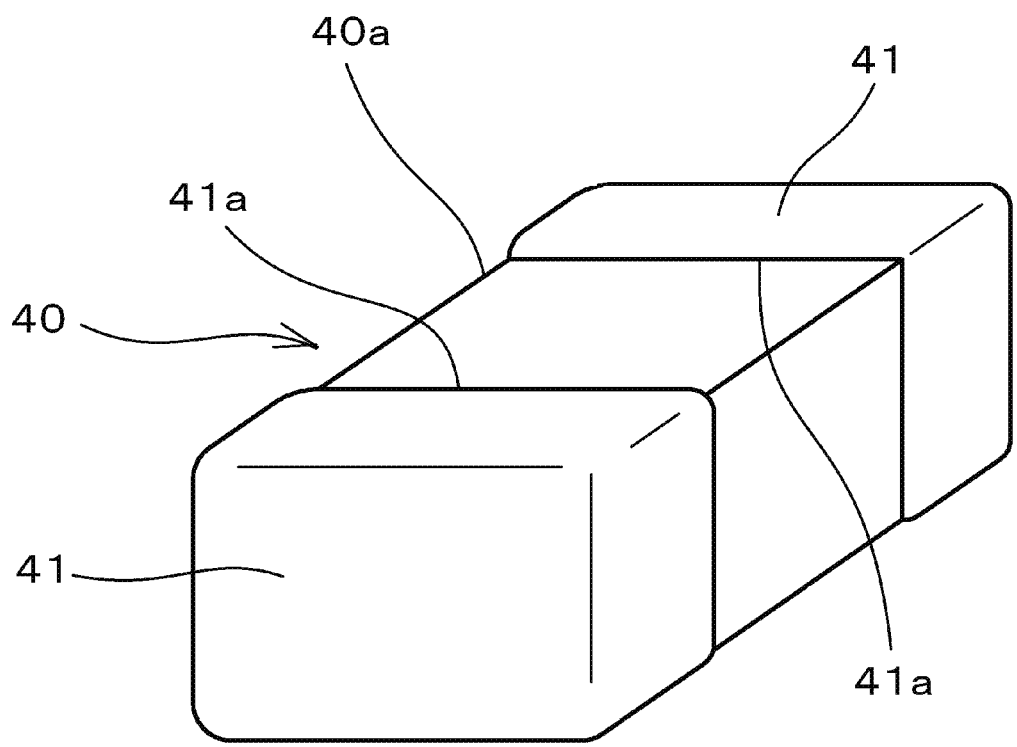
FIG. 4 is a perspective view illustrating the outer shape of a multilayer ceramic capacitor.

FIG. 4 is a perspective view illustrating the outer shape of a multilayer ceramic capacitor 40. The multilayer ceramic capacitor 40 includes a rectangular parallelepiped ceramic laminated body 40a obtained by alternately laminating a plurality of internal electrodes and dielectrics, and a pair of external electrodes 41 provided at both end parts of the ceramic laminated body 40a.

Figure 5:
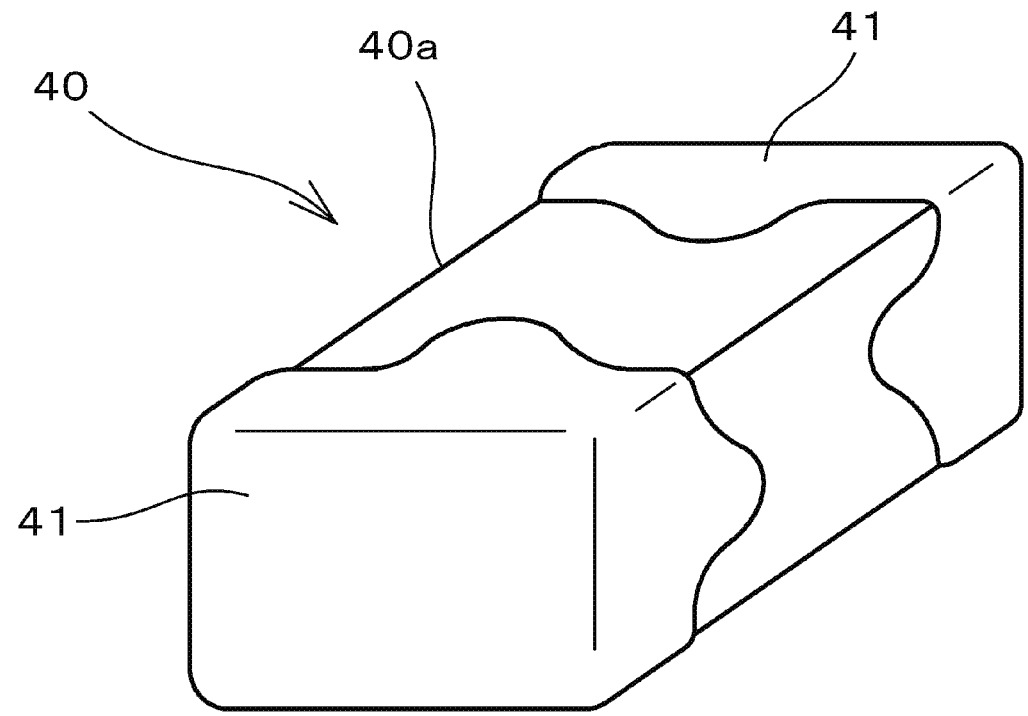
FIG. 5 is a diagram for description that metal paste spreads when applied without coating.

The external electrodes 41 are formed by applying metal paste to both end parts of the ceramic laminated body 40a and baking the metal paste. The metal paste is a mixture of metallic powder or glass with an alcohol organic solvent such as terpineol. However, when directly applied, the metal paste spreads to central parts of principal surfaces and side surfaces of the ceramic laminated body 40a, and the external electrodes 41 potentially have shapes as illustrated in FIG. 5. Consequently, the pair of external electrodes 41 become unbalanced to potentially cause what is called a tombstone phenomenon where the multilayer ceramic capacitor 40 stands up when mounted, which is not preferable.

Thus, it is preferable to reduce the spreading of the metal paste by performing oil repelling coating of the surface of the ceramic laminated body 40a before application of the metal paste. This oil repelling coating is performed by the coating device 100 in the present embodiment.

Gaseous material for the oil repelling coating is fluorocarbon gas such as $CF_4$, $C_2F_6$, $C_3F_8$, or $C_4F_8$. This fluorocarbon gas is subjected to plasma polymerization to produce plasma polymer including monomers such as CF, CF2, and CF3, thereby coating the surface of the ceramic laminated body 40a with the generated plasma polymer. This coating is nano coating with a film thickness of 10 nm to 300 nm, for example.

CF included in the plasma polymer used in the coating has a surface tension of 6 mN/m approximately. CF2 has a surface tension of 6 mN/m approximately, and CF3 has a surface tension of mN/m approximately. Terpineol included in the metal paste used to form the external electrodes 41 has a surface tension of 38 mN/m approximately.

In other words, the spreading of the metal paste is reduced by coating the surface of the ceramic laminated body 40a as a processing target with the plasma polymer including CF, CF2, and CF3 so as to set the tension surface of the ceramic laminated body 40a to be smaller than the surface tension of terpineol included in the metal paste.

The following describes a method of coating a processing target by the coating device 100 in the present embodiment. The processing target is, for example, the ceramic laminated body 40a described above.

First, a plurality of processing targets are placed inside the housing case 3, and then the housing case 3 is placed on the rotation body inside the chamber or electrode 1. Specifically, the housing case 3 is placed to be supported from below by the rotation body. In this state, as illustrated in FIGS. 1 and 2, the electrode 2 is positioned substantially at a central part of the housing case 3.

Subsequently, a vacuum state is achieved inside the chamber or electrode 1 through suction using, for example, a vacuum pump.

Subsequently, argon (Ar) gas is put into the chamber or electrode 1 and voltage is applied between the electrode 1 and the electrode 2 to generate plasma for removing any foreign object on the surfaces of the processing targets through argon plasma processing. Since this argon plasma processing removes any foreign object on the surfaces of the processing targets, the following oil repelling coating can be uniformly performed on the surfaces of the processing targets. However, the argon plasma processing may be omitted.

Subsequently, the voltage application between the electrode 1 and the electrode 2 is stopped to switch gas in the chamber or electrode 1, in particular, inside the housing case 3 from argon (Ar) to $C_4F_8$. However, the gaseous material used for the coating is not limited to $C_4F_8$, but may be $CF_4$, $C_2F_6$, or $C_3F_8$.

Subsequently, while the housing case 3 is being rotated, voltage is applied between the electrode 1 and the electrode 2 to generate plasma and produce plasma polymer including monomers such as CF, CF2, and CF3, with which the surfaces of the processing targets are coated. In this example, voltage of 30 V to 120 V was applied to perform coating for 30 seconds to 120 seconds.

As described above, since the coating is performed while the housing case 3 provided with the stirring plate 3b inside is being rotated, the processing targets inside the housing case 3 are effectively stirred through the rotation of the housing case 3. In this manner, the coating is performed on the processing targets being stirred to roll, and thus can be uniformly performed on the entire surface of each of a large number of processing targets housed in the housing case 3.

In particular, since the stirring plate 3b is formed in a helical shape, when the housing case 3 is rotated, the processing targets move inside the housing case 3 in the longitudinal direction (y-axis direction in FIG. 1) while rolling. Accordingly, the processing targets are effectively stirred as compared to a case in which the processing targets each stay at the same position inside the housing case 3 in the longitudinal direction, thereby making it possible to more reliably perform coating of the entire surface of the processing targets.

Subsequently, the voltage application between the electrode 1 and the electrode 2 is stopped to eject the gas in the chamber or electrode 1, in particular, inside the housing case 3. Thereafter, vacuum breakdown is performed.

Lastly, the housing case 3 is taken out of the chamber or electrode 1, and the processing targets are taken out of the housing case 3.

The ceramic laminated body 40a as a processing target thus taken out is provided with an appropriate oil repelling property. This property appropriately reduces wetting-up of conductive paste applied on both end parts of the ceramic laminated body 40a through, for example, immersion in the conductive paste. As a result, the multilayer ceramic capacitor can have a straight wrapping end part 41a of each external electrode 41, so that the tombstone phenomenon through a mounting process by soldering is not potentially caused.

To check any effect of the coating using the coating device according to the present embodiment, X-ray photoelectron spectroscopy (XPS) was performed to measure the amount of fluorine adhered to the surface of the ceramic laminated body 40a on which the oil repelling coating had been performed by using the coating device 100 in the present embodiment. The measurement was performed at a central part of each side of the ceramic laminated body 40a.

When the coating was performed by using the coating device 100 in the present embodiment, the amount of fluorine had no difference between the sides of the ceramic laminated body 40a.

In a conventional coating method, a ceramic laminated body as a processing target is placed on a flat plate and plasma polymer is sprayed toward the ceramic laminated body from above. In this method, the amount of fluorine on the back surface of the ceramic laminated body, which was in contact with the flat plate, was smaller by 20% or more than the amount of fluorine on the upper surface thereof.

When coating was performed on processing targets having different dimensions by the conventional coating method, it was found that the amount of fluorine adhered to the back surface differed depending the size of each processing target.

This indicates that plasma polymer is more unlikely to cover the back surface of a larger processing target, leading to reduction in the amount of fluorine adhered to the back surface. In particular, plasma polymer is unlikely to cover the back surface of a processing target having a dimension of 2.0 mm or larger in a longitudinal direction, a dimension of 1.2 mm or larger in the width direction, and a dimension of 1.2 mm or larger in the thickness direction.

It was also found, however, that plasma polymer is likely to cover the back surface of a processing target having a dimension of 1.0 mm or smaller in the longitudinal direction, a dimension of 0.5 mm or smaller in the width direction, and a dimension of 0.5 mm or smaller in the thickness direction in the conventional coating method. It was also found that, when a processing target is chamfered, in other words, has rounded edges, in the conventional coating method, plasma polymer is likely to cover the back surface of the processing target.

When the coating was performed by using the coating device 100 in the present embodiment, however, it was found that fluorine was uniformly adhered to all surfaces irrespective of the size of a ceramic laminated body as a processing target and the shapes of edges thereof. Thus, the coating device 100 in the present embodiment is effective when coating is performed on a processing target having a large dimension that makes it difficult to perform uniform coating of the back surface thereof by the conventional coating method, for example, a processing target having a dimension of 2.0 mm or larger in the longitudinal direction, a dimension of 1.2 mm or larger in the width direction, and a dimension of 1.2 mm or larger in the thickness direction.

As described above, the coating device 100 in the present embodiment performs coating while the housing case 3 is being rotated to stir a plurality of processing targets through the stirring plate 3b provided on the internal wall of the housing case 3. With this configuration, when the housing case 3 houses therein a plurality of processing targets being placed on top of one another, it is possible to reliably roll each processing target to uniformly perform coating on the entire surface of the processing target.

When the housing case 3 is cylindrical and the stirring plate 3b is formed in a helical shape along the internal wall of the housing case 3, a plurality of processing targets are movable in the longitudinal direction of the housing case 3 and thus effectively stirred when the housing case 3 is rotated. Accordingly, coating can be more uniformly performed on the entire surface of the processing targets.

The electrode 1 and the electrode 2 are further provided for voltage application to achieve a plasma state of gas put in the housing case 3, thereby producing plasma polymer, with which the surfaces of the processing targets are coated. For example, as in the above-described embodiment, fluorocarbon gas such as CF4, C2F6, C3F8, or C4F8 can be used to generate plasma and produce plasma polymer including monomers such as CF, CF2, and CF3, with which the surfaces of the processing targets are coated.

The surface of a processing target can be provided with an oil repelling property through the oil repelling coating thereon. In addition, the surface of the processing target can be provided with a lipophilic property through lipophilic coating as described later.

When an electric component is a processing target, desired coating can be uniformly performed on the surface of the electric component. This coating reduces wetting-up of conductive paste, for example, in a process of forming the external electrodes 41 as illustrated in FIG. 4, and provides the wrapping end part 41a in a straight shape, thereby achieving the electric component unlikely to cause the tombstone phenomenon in a process of mounting the electric component by soldering.

In the coating method in the present embodiment, while the housing case 3 housing therein a plurality of processing targets and provided with the stirring plate 3b protruding from the internal wall thereof is being rotated, gas is put into the housing case 3 through the through-holes 3a provided to the housing case 3, thereby coating the processing targets. Accordingly, when the housing case 3 houses therein a plurality of processing targets being placed on top of one another, it is possible to reliably roll each processing target to perform uniform coating of the entire surface of the processing target.

The present disclosure is not limited to the above-described embodiment. For example, in the above-described embodiment, the housing case 3 is placed in the chamber or electrode 1 to performed coating of the surfaces of a plurality of processing targets inside the housing case 3. However, it is possible to provide a high sealing property to the housing case 3 to use the housing case 3 as a chamber. In this case, the chamber or electrode 1 is not needed. However, when plasma polymer is to be produced to coat a processing target, electrodes for voltage application are needed to generate plasma.

The shape of the stirring plate 3b provided on the internal wall of the housing case 3 is not limited to a helical shape. For example, the stirring plate 3b may be a plurality of plate members protruding from the internal wall of the housing case 3 and extending in the longitudinal direction of the housing case 3. In this case, one or a plurality of plate members protruding from the internal wall of the housing case 3 may be provided to serve as the stirring plate 3b.

Although a ceramic laminated body formed in the process of manufacturing a multilayer ceramic capacitor is described as an exemplary processing target, the processing target may be any electric component other than a ceramic laminated body or any object other than an electric component.

In the above-described embodiment, a processing target is coated by achieving a plasma state of the gas put in the housing case 3, the coating may be performed without achieving the plasma state. In this case, the electrode 1 and the electrode 2, which are used for voltage application, may be omitted.

In the above-described embodiment, coating is performed on the surface of a processing target to provide an oil repelling property. When the gaseous material the same as that of the above-described embodiment is used, however, voltage applied between the electrode 1 and the electrode 2, a coating time, or the like can be controlled to achieve a weak oil repelling property, which then substantially provides a lipophilic property to the surface of the processing target.

It is also possible to aggressively use gaseous material capable of forming a coating film having a lipophilic property, thereby providing a lipophilic property to the surface of a processing target. In this case, for example, SiC gas is used as the gaseous material to perform coating.

What is claimed is:

1. A coating device including a housing case capable of housing a plurality of processing targets therein and configured to coat the plurality of processing targets with a gaseous component by taking gas into the housing case,
the coating device comprising:
   a rotation unit configured to rotate the housing case;
   a first electrode in which the housing case is placed; and
   a second electrode housed inside the housing case,
wherein
   the housing case includes a through-hole for taking the gas inside, an insulation wall made of electrically insulating material and capable of housing the second electrode inside, and a stirring plate fixed to and protruding from an internal wall of the housing case to stir the plurality of processing targets.

2. The coating device according to claim 1, wherein
the housing case includes end faces in a longitudinal direction of the housing case and an outer peripheral wall that is cylindrical, and
the stirring plate is formed in a helical shape along the internal wall of the housing case.

3. The coating device according to claim 2, wherein
a plurality of through-holes for taking the gas inside are disposed on the end face of the housing case.

4. The coating device according to claim 3, wherein
the plurality of through-holes for taking the gas inside are disposed on both of the end faces of the housing case.

5. The coating device according to claim 1, wherein the coating provides one of an oil repelling property and a lipophilic property to surfaces of the plurality of processing targets.

6. The coating device according to claim 1, wherein
the housing case includes end faces in a longitudinal direction of the housing case and an outer peripheral wall that is cylindrical, and
a plurality of through-holes for taking the gas inside that are provided on an outer peripheral wall of the housing case.

7. The coating device according to claim 1, wherein the insulating wall is made of glass.

8. A coating method of coating, by a coating device, a plurality of processing targets with a gaseous component by taking gas into a housing case capable of housing the plurality of processing targets therein, the coating device comprising:
   the housing case;
   a rotation unit configured to rotate the housing case;
   a first electrode in which the housing case is placed; and
   a second electrode housed inside the housing case,
wherein
   the housing case includes a through-hole for taking the gas inside, an insulation wall made of electrically insulating material and capable of housing the second electrode inside, and a stirring plate fixed to and protruding from an internal wall of the housing case to stir the plurality of processing targets, the method comprising:
   taking the gas into the housing case through the through-hole provided in the housing case; and
   coating the plurality of processing targets while rotating the housing case housing the plurality of processing targets therein and provided with the stirring plate protruding from the internal wall of the housing case.

9. The coating method according to claim 8, wherein
the housing case is cylindrical, and
the stirring plate is formed in a helical shape along the internal wall of the housing case.

10. A coating device including a housing case capable of housing a plurality of processing targets therein and configured to coat the plurality of processing targets with a gaseous component by taking gas into the housing case,
the coating device comprising:
   a rotation unit configured to rotate the housing case;
   a first electrode in which the housing case is placed; and
   a second electrode housed inside the housing case,
wherein
   the housing case includes a through-hole for taking the gas inside, and a stirring plate fixed to and protruding from an internal wall of the housing case to stir the plurality of processing targets,
   the housing case includes end faces in a longitudinal direction of the housing case and an outer peripheral wall that is cylindrical, and
   the stirring plate is formed in a helical shape along the internal wall of the housing case, and
   a plurality of through-holes for taking the gas inside are disposed on the end face of the housing case.

11. The coating device according to claim 10, wherein
the plurality of through-holes for taking the gas inside are disposed on both of the end faces of the housing case.

12. The coating device according to claim 10, wherein
a plurality of through-holes for taking the gas inside are provided on an outer peripheral wall of the housing case.

* * * * *